(12) United States Patent
Narang et al.

(10) Patent No.: US 11,455,564 B2
(45) Date of Patent: Sep. 27, 2022

(54) QUBIT ALLOCATION FOR NOISY INTERMEDIATE-SCALE QUANTUM COMPUTERS

(71) Applicant: President and Fellows of Harvard College, Cambridge, MA (US)

(72) Inventors: Prineha Narang, Somerville, MA (US); Will Thomas Finigan, Cambridge, MA (US); Michael Cubeddu, Cambridge, MA (US); Yudong Cao, Cambridge, MA (US); Thomas Richard Lively, Mountain View, CA (US)

(73) Assignee: President and Fellows of Harvard College, Cambridge, MA (US)

( * ) Notice: Subject to any disclaimer, the term of this patent is extended or adjusted under 35 U.S.C. 154(b) by 431 days.

(21) Appl. No.: 16/659,406

(22) Filed: Oct. 21, 2019

(65) Prior Publication Data

US 2020/0125985 A1  Apr. 23, 2020

Related U.S. Application Data

(60) Provisional application No. 62/748,475, filed on Oct. 21, 2018, provisional application No. 62/835,807, filed on Apr. 18, 2019.

(51) Int. Cl.
*G06N 10/00* (2022.01)
*H03K 19/20* (2006.01)
*G06F 17/18* (2006.01)

(52) U.S. Cl.
CPC ............ *G06N 10/00* (2019.01); *G06F 17/18* (2013.01); *H03K 19/20* (2013.01)

(58) Field of Classification Search
CPC ......... G06N 10/00; G06F 17/18; H03K 19/20
See application file for complete search history.

(56) References Cited

U.S. PATENT DOCUMENTS

| 2014/0250288 A1* | 9/2014 | Roy | B82Y 10/00 |
| | | | 712/223 |
| 2014/0324933 A1* | 10/2014 | Macready | G06N 5/003 |
| | | | 708/200 |

* cited by examiner

*Primary Examiner* — Kyle Vallecillo
(74) *Attorney, Agent, or Firm* — Foley Hoag LLP; Alexander Akhiezer; Erik A. Huestis

(57) ABSTRACT

Qubit allocation for noisy intermediate-scale quantum computers is provided. A quantum circuit comprises a plurality of logical qubits. A hardware specification comprising a connectivity graph of a plurality of physical qubits. A directed acyclic allocation graph is determined based on the plurality of logical qubits and the connectivity graph. The allocation graph comprises a node for each possible allocation of the plurality of logical qubits to the plurality of physical qubits, each allocation having a fidelity, and a plurality of directed edges, each edge connecting to its corresponding first node from its corresponding second node, the first node corresponding to a first allocation, the second node corresponding to a sub-allocation of the first allocation. The allocation graph is searched for a weighted shortest path from a root node of the allocation graph to a leaf node of the allocation graph. The allocation corresponding to the weighted shortest path is outputted.

34 Claims, 14 Drawing Sheets

| Gate | Notation | Matrix |
|---|---|---|
| NOT (Pauli-X) |  | $\begin{bmatrix} 0 & 1 \\ 1 & 0 \end{bmatrix}$ |
| Pauli-Z |  | $\begin{bmatrix} 1 & 0 \\ 0 & -1 \end{bmatrix}$ |
| Hadamard |  | $\frac{1}{\sqrt{2}}\begin{bmatrix} 1 & 1 \\ 1 & -1 \end{bmatrix}$ |
| CNOT (Controlled NOT) |  | $\begin{bmatrix} 1 & 0 & 0 & 0 \\ 0 & 1 & 0 & 0 \\ 0 & 0 & 0 & 1 \\ 0 & 0 & 1 & 0 \end{bmatrix}$ |
| MEASURE |  | |

QUBIT ALLOCATION FOR NOISY INTERMEDIATE-SCALE QUANTUM COMPUTERS

CROSS-REFERENCE TO RELATED APPLICATIONS

This application claims the benefit of U.S. Provisional Application No. 62/748,475, filed Oct. 21, 2018, and U.S. Provisional Application No. 62/835,807, filed Apr. 18, 2019, which are hereby incorporated by reference in their entireties.

STATEMENT REGARDING FEDERALLY SPONSORED RESEARCH

This invention was made with Government support under Grant No. DMR-1231319 awarded by the National Science Foundation. The Government has certain rights to this invention.

BACKGROUND

Embodiments of the present disclosure relate to compilers for quantum computers, and more specifically, to qubit allocation for noisy intermediate-scale quantum computers.

BRIEF SUMMARY

According to embodiments of the present disclosure, methods of and computer program products for quantum problem compilation are provided. In various embodiments, a description of a quantum circuit is received. The quantum circuit comprises a plurality of logical qubits. A hardware specification is received. The hardware specification comprises a connectivity graph of a plurality of physical qubits. A directed acyclic allocation graph is determined based on the plurality of logical qubits and the connectivity graph. The allocation graph comprises a node for each possible allocation of the plurality of logical qubits to the plurality of physical qubits, each allocation having a fidelity, and a plurality of directed edges, each edge connecting to its corresponding first node from its corresponding second node, the first node corresponding to a first allocation, the second node corresponding to a sub-allocation of the first allocation. The allocation graph is searched for a weighted shortest path from a root node of the allocation graph to a leaf node of the allocation graph. The allocation corresponding to the weighted shortest path is outputted.

In various embodiments, each edge of the allocation graph has a weight corresponding to a difference between a fidelity of the allocation corresponding to its first node and a fidelity of the sub-allocation corresponding to its second node. In various embodiments, each node of the allocation graph has a weight corresponding to a fidelity of its corresponding allocation.

In various embodiments, searching the allocation graph comprises: selecting a parent node; determining a next node, the next node being a child of the parent node, by: setting the next node to a first child of the parent node, searching the allocation graph from the first child of the parent node, said searching being limited to a predetermined number of steps, thereby determining a cost corresponding to the first child, searching the directed acyclic allocation graph from a second child of the parent node, said searching being limited to the predetermined number of steps, thereby determining a cost corresponding to the second child, if the cost corresponding to the second child is less than the cost corresponding to the first child, setting the next node to the second child, if the cost corresponding to the second child is not less than the cost corresponding to the first child, setting the next node to the second child with an iteration-dependent probability.

In various embodiments, the iteration-dependent probability is additionally dependent on a difference between the cost corresponding to the first child and the cost corresponding to the second child. In various embodiments, determining the next node further comprises repeatedly: searching the allocation graph from an additional child of the parent node, said searching being limited to the predetermined number of steps, thereby determining a cost corresponding to the additional child, if the cost corresponding to the additional child is less than the cost corresponding to the next node, setting the next node to the additional child, if the cost corresponding to the additional child is not less than the cost corresponding to the next node, setting the next node to the additional child with a time-dependent probability. In various embodiments, said determining step is repeated until reaching a leaf node of the allocation graph. In various embodiments, each repetition of said determining step allocates one more qubit that the immediately prior determining step.

In various embodiments, searching the allocation graph comprises applying a randomized graph search. In some embodiments, the randomized graph search comprises nested annealing. In some embodiments, the randomized graph search comprises parallel tempering. In some embodiments, the randomized graph search comprises genetic optimization.

In various embodiments, searching the allocation graph comprises identifying a plurality of candidate leaf nodes, and selecting one of the plurality of candidate leaf nodes corresponding to the weighted shortest path.

In various embodiments, at least one reverse edge is added to the connectivity graph corresponding to a CNOT. In various embodiments, at least one reverse edge is added to the connectivity graph corresponding to a two-cubit gate.

In various embodiments, for each of the plurality of directed edges, the first allocation allocates one more logical qubit than the sub-allocation.

In various embodiments, for each of the plurality of directed edges, the weight corresponds to a difference in upper bounds on fidelities of the first allocation and the sub-allocation. In various embodiments, for each of the plurality of directed edges, the weight corresponds to a difference in lower bounds on fidelities of the first allocation and the sub-allocation.

In various embodiments, the graph comprises a tree.

In various embodiments, searching the graph comprises applying Dijkstra's algorithm. In various embodiments, searching the graph comprises applying an A* search algorithm. In various embodiments, searching the graph comprises applying a breadth-first search.

In various embodiments, searching the graph comprises applying a depth first search. In various embodiments, searching the graph comprises applying a depth-first branch-and-bound search. In various embodiments, searching the graph comprises applying an iterative deepening A* search. In various embodiments, searching the graph comprises applying a parallel depth-first search.

In various embodiments, the connectivity graph comprises a plurality of edges and the hardware specification further comprises fidelities for each of the plurality of edges of the connectivity graph.

In various embodiments, the quantum circuit is executed on a quantum computer according to the allocation corresponding to the weighted shortest path.

In various embodiments, the quantum circuit is simulated according to the allocation corresponding to the weighted shortest path.

In various embodiments, a quantum circuit description is output according to the allocation corresponding to the weighted shortest path. In some embodiments a quantum computer is configured according to the quantum circuit description.

In various embodiments, a set of allocations is output, corresponding to a plurality of weighted shortest paths. The set includes the allocation corresponding to the weighted shortest path.

DETAILED DESCRIPTION

Figure 1:
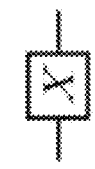
FIG. 1 is a schematic view of various exemplary quantum gates are illustrated in both standard notation and matrix form.
Figure 1:
Figure 1:
Figure 1:
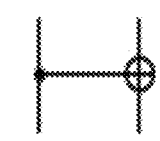
Figure 1:
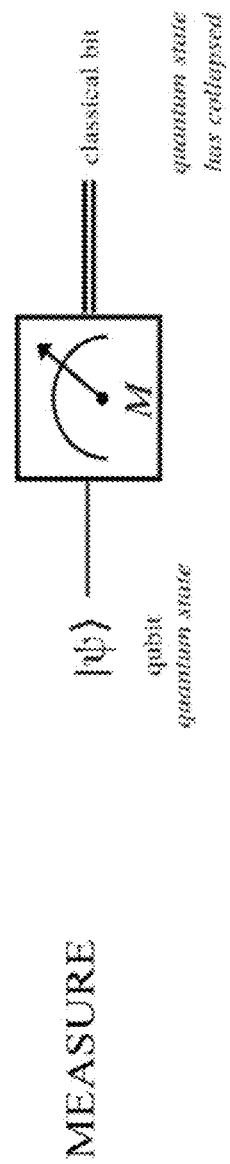

As the field of quantum computing progresses, devices with increasing numbers of qubits will emerge. These devices are inherently noisy, and one way of efficiently reducing the noise of quantum computations is by using a compiler during pre-processing that optimizes and modifies the quantum circuit for the specific device it is to be run on. One important problem in circuit optimization is the Qubit Allocation Problem, which involves mapping logical qubits from the quantum circuit to physical qubits on the hardware device, such that its connectivity constraints are satisfied and the total cost of the computation is minimized.

However, the Qubit Allocation problem is NP-complete and optimal solutions are prohibitively expensive. Accordingly, the present disclosure provides an approach that uses a directed local search over a reduced solution space. To avoid exponential running time, various embodiments combine this local search with a randomized optimization algorithm, allowing end users to trade off time and solution quality.

Existing quantum computing technology, sometime referred to as noisy-intermediate scale quantum' (NISQ) technology, allows the realization of systems with fewer than 100 qubits in experimental laboratories. In the short term, most results from quantum simulations will be inherently noisy. This noise exists due to multiple factors: qubits can only stay in a mixed state for a certain period of time, the entangling and rotational operations are susceptible to accuracy errors, and the error rate of these qubit operations are affected by subtle changes in the surrounding environment as well. In order for NISQ-era computers to execute quantum circuits efficiently, reducing the noise of the computation is essential for maximizing the reliability of the result.

One way to approach efficient noise reduction for quantum computations is by introducing a pre-processing step, e.g., using a classical compiler. In traditional computer science, compilers translate a program written according to a certain language specification into an equivalent program in some target language. Generally, a compiler translates programs written in some high-level language, such as Python or Java, into a low-level language, such as the assembler or machine language that can be executed on a hardware device. Similarly, a compiler for a quantum program, or a quantum compiler, translates some specification of a quantum program into a set of instructions that can be read by a specific device.

Various examples herein are given in terms of quantum programs written in the most prevalent instruction languages in the development community, QUIL and Open QASM. While both of these languages are akin to classical instruction languages, they are high-level in the sense that they are not limited by the same restrictions as the hardware. It will be appreciated that the present disclosure is applicable to a variety of additional languages beyond these exemplary ones.

The present disclosure addresses the problem of converting abstract circuits (circuits written without hardware restrictions) into machine executable instructions. One important optimization step within the compiler is Qubit allocation. The allocation of the qubits refers to the process of mapping logical qubits from the quantum circuit to physical qubits on the hardware under the constraint of satisfying the hardware connectivity and further minimizing the total cost of the computation.

The present disclosure provides algorithms that set a new standard for practical compilers for NISQ-era computers, and demonstrated their benefits on larger circuits and hardware. In various embodiments, the algorithm executes a bounded local A* search algorithm that is designed with the circuit-specific cost as the objective function, which is a well-suited search method, on a problem space that is reduced by a randomization scheme.

This algorithm is hardware-agnostic, as in it is effective across different physical implementations of quantum computing architectures, and it uses hardware-aware policies as a guide for choosing the allocation for the circuit that best-suits the hardware. Input parameters allow the user to specify a desired tradeoff between time spent on finding an allocation and the resulting fidelity of that allocation. The search algorithm also takes care of inserting SWAP gates as necessary. The need for topological SWAP's arises due to the limited connectivity of modern hardware architectures, especially in superconducting qubit devices.

The hybrid algorithms provided herein are applicable to device specifications provided through API's from hardware providers. Device specifications, such as gate and measurement fidelity, can vary greatly over time. A small change in these values can have a significant impact on the performance of a circuit. Thus, maintaining up-to-date information is crucial to deploying usable programs.

Algorithms provided herein are benchmarked, showing that the solutions proposed in this paper significantly improves on alternative methods on multiple metrics. These benchmarks are the first time a proposed quantum compiler has been formally tested on physical hardware.

Whereas (digital) classical computers run on classical bits, which represent a binary state of value 0 or 1, the fundamental unit of quantum computers is called a qubit. The state of a qubit can be 0, 1, but also a superposition of 0 and 1. Quantum computers leverage this mixed state to perform more complex computations, as each qubit can represent more information than a binary classical bit. Quantum computing and quantum information science involves manipulating qubits' states to achieve a computational task and analyzing their output states.

As used herein, a quantum gate (or quantum logic gate) is a basic quantum circuit operating on a small number of qubits. By analogy to classical computing, quantum gates form quantum circuits, like classical logic gates form conventional digital circuits. Quantum logic gates are represented by unitary matrices. Various common quantum gates operate on spaces of one or two qubits, like classical logic gates operate on one or two bits. As matrices, quantum gates can be described by $2^n \times 2^n$ sized unitary matrices, where n is the number of qubits. The variables that the gates act upon, the quantum states, are vectors in $2^n$ complex dimensions. The base vectors indicate the possible outcomes if measured, and a quantum state is a linear combinations of these outcomes. The action of the gate on a specific quantum state is found by multiplying the vector which represents the state by the matrix representing the gate. Accordingly, a given quantum state may be prepared on a quantum circuit through application of a plurality of gates. A given state may be characterized as a distribution function that provides a distribution describing a continuous random variable.

Various physical embodiments of a quantum computer are suitable for use according to the present disclosure. In general, the fundamental data storage unit in quantum computing is the quantum bit, or qubit. The qubit is a quantum-computing analog of a classical digital-computer-system bit. A classical bit is considered to occupy, at any given point in time, one of two possible states corresponding to the binary digits 0 or 1. By contrast, a qubit is implemented in hardware by a physical component with quantum-mechanical characteristics. Each unit has an infinite number of different potential quantum-mechanical states. When the state of a qubit is physically measured, the measurement produces one of two different basis states. Thus, a single qubit can represent a one, a zero, or any quantum superposition of those two qubit states; a pair of qubits can be in any quantum superposition of 4 states; and three qubits in any superposition of 8 states. While qubits are characterized herein as mathematical objects, each corresponds to a physical qubit that can be implemented using a number of different physical implementations, such as trapped ions, optical cavities, individual elementary particles, molecules, or aggregations of molecules that exhibit qubit behavior.

In some embodiments, a quantum circuit comprises non-linear optical media. In some embodiments, a quantum circuit comprises a cavity quantum electrodynamics device. In some embodiments, a quantum circuit comprises an ion trap. In some embodiments, a quantum circuit comprises a nuclear magnetic resonance device. In some embodiments, a quantum circuit comprises a superconducting device. In some embodiments, a quantum circuit comprises a solid state device.

In contrast to classical gates, there are an infinite number of possible single-qubit quantum gates that change the state vector of a qubit. Changing the state of a qubit state vector is therefore referred to as a rotation. A rotation, state change, or single-qubit quantum-gate operation may be represented mathematically by a unitary 2×2 matrix with complex elements.

A quantum circuit can be specified as a sequence of quantum gates. To conceptualize a quantum circuit, the matrices corresponding to the component quantum gates may be multiplied together in the order specified by the symbol sequence to produce a 2×2 complex matrix representing the same overall state change. A quantum circuit may thus be expressed as a single resultant operator. However, designing a quantum circuit in terms of constituent gates allows the design to conform to standard sets of gates, and thus enable greater ease of deployment. A quantum circuit thus corresponds to a design for a physical circuit in a quantum computer.

Gates can operate on any number of qubits, although one-qubit gates and two-qubit gates are common. Examples of one-qubit gates include the Pauli X, Y, and Z gates, which act on a single qubit and correspond to a rotation around the X, Y, or Z axis of the Bloch sphere of the qubit. One example of a two-qubit gate is a matchgate, which is defined by a 4×4 matrix. It will be appreciated that additional two-qubit gates may be defined by 4×4 unitary matrices, or in terms of their constituent rotations.

In the physical system, qubits can represent the ground state, $|0\rangle$, the excited state, $|1\rangle$, or a superposition of the two. The state of a qubit can be represented by a vector composed as a linear combination of the two basis vectors. Using Dirac notation, the state $|\Psi\rangle$ of a qubit can be described as:

$$|\Psi_1\rangle = \alpha_1|0\rangle + \beta_1|1\rangle \quad \text{Equation 1}$$

where α and β are complex (c) numbers and are normalized as $|\alpha_1|^2 + |\beta_1|^2 = 1$.

Analogously, for a general two-qubit state, $$|\Psi_2\rangle = \alpha_2|00\rangle + \beta_2|01\rangle + \gamma_2|10\rangle + \delta_2|11\rangle \quad \text{Equation 2}$$

with $|\alpha_2|^2 + |\beta_2|^2 + |\gamma_2|^2 + |\delta_2|^2 = 1$.

In a quantum computation, the state of a qubit $|\Psi_{1/2}\rangle$ can be manipulated and controlled by quantum gates, which are essentially matrix operations applied to the quantum state.

Referring to FIG. 1, various exemplary quantum gates are illustrated in both standard notation and matrix form.

These quantum gates operate on either single qubits (e.g., Hadamard gate, X gate, or PHASE gate) or multiple qubits (e.g., Controlled NOT gate, SWAP gate, or Controlled PHASE gate). Certain multi-qubit gates require specification of a control qubit and a target qubit. For example, the Controlled NOT (CNOT) gate flips the state of the target qubit, represented as ⊕, through a NOT gate, conditional on the control qubit, represented as being set to the basis state $|1\rangle$.

Along with their respective circuit diagram notations, other single-qubit gates include qubit rotations (Pauli-Z), mixed-state preparations (Hadamard), and the MEASURE gate which collapses a qubit's quantum state to a classical bit state (either $|0\rangle$ or $|1\rangle$). The gates in FIG. 1 are not representative of all quantum gates, but they are some of the most commonly used gates in quantum computing.

The SWAP gate is described in more detail below. Understanding the composition of the SWAP gate is important for the qubit allocation problem on hardware with constrained connectivity. A SWAP instruction applied to two qubits a and b moves the data stored in qubit a to qubit b and vice versa. The introduction of SWAP gates are required during compilation for physically moving the data representing the logical qubits throughout the hardware, due to the limited connectivity of the actual device. Compilers need to take SWAP gates into account during the qubit allocation process because they are computationally expensive, relative to other two qubit gates. The decomposition of a SWAP gate applied to two immediately connected physical qubits, $q_0$ and $q_1$, can be seen in FIG. 2.

SWAPs are implemented via either of the two methods above, where each implementation consists of 3 CNOTs. An efficient compiler would choose the cost-minimizing implementation, which depends on the error rate of the directed edge connecting $q_0$ to $q_1$ and the error rate of $q_1$ to $q_0$.

Quantum algorithms are represented by quantum circuits. A quantum circuit consists of logical qubits that are initialized to a specified initial state from which they will be manipulated and/or entangled through a series of quantum gates, with the goal of solving a computational problem through the information contained in their resulting state(s). Quantum circuits can be described in several ways: using a high-level quantum language such as Scaffold or Quipper, a quantum assembly/instruction language such as IBM's OpenQASM 2.0 or Rigetti Computing's QUIL, or using circuit diagrams. Various quantum circuits are described herein using circuit diagrams, but when dealing with software and compilers, quantum circuits are best represented in one of the listed languages above.

Figure 3:
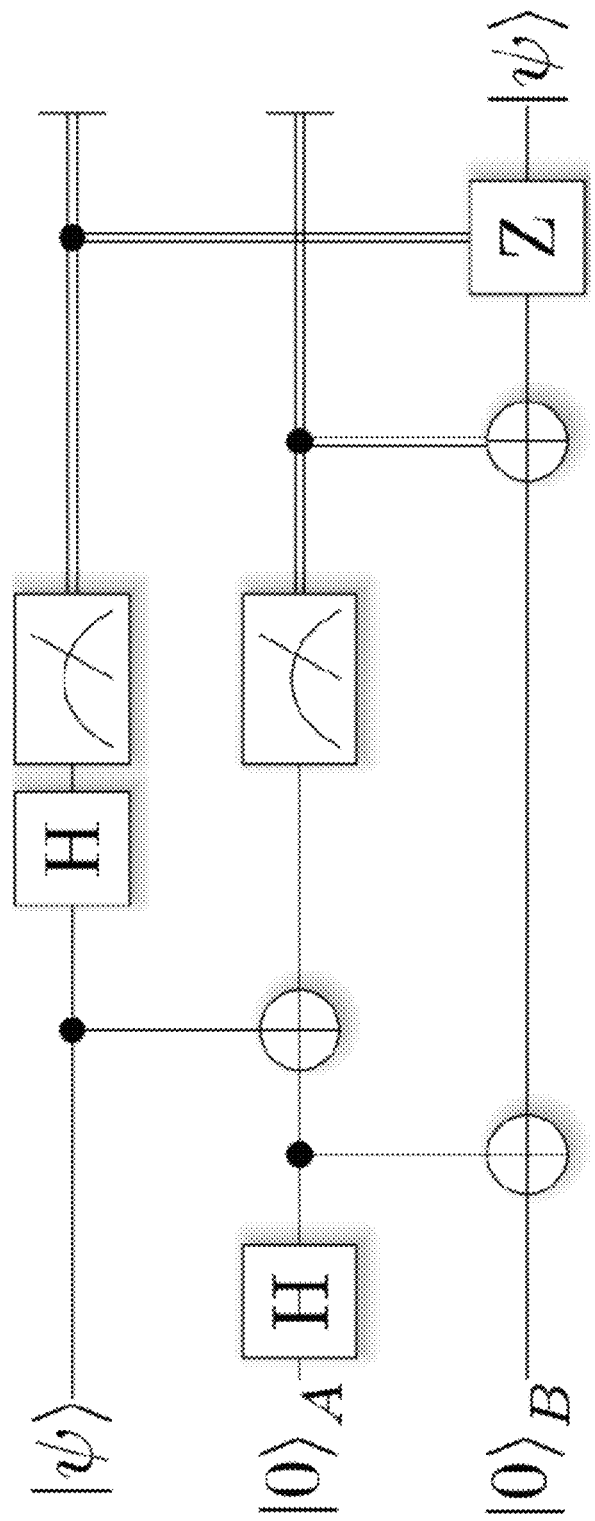
FIG. 3 is a schematic view of the quantum teleportation circuit.

In diagram format, each rail (horizontal line) represents a different logical qubit, and the sequence in which the gates are applied to the qubits is simply from left to right. An example of the quantum teleportation circuit can be seen in FIG. 3. It involves 3 logical qubits, and the goal of the circuit is to transfer the quantum state $|\Psi\rangle$ from the first logical qubit to the third. The dual rails represent classical bits because after the two measurement gates on the first two qubits, their states collapse into a classical state, either $|0\rangle$ or $|1\rangle$, from which the computer will decide to apply a NOT gate or a Pauli-Z gate to the third logical qubit.

In general, a graph is an ordered pair $G=(V, E)$ comprising a set V of vertices (also called nodes or points) together with a set E of edges (also called links or lines), which are 2-element subsets of V. That is, an edge is associated with two vertices, and the association takes the form of the pair of the vertices.

An undirected graph is a graph in which edges have no orientation. The edge (x, y) is identical to the edge (y, x). That is, they are not ordered pairs, but unordered pairs—sets of two vertices {x, y}.

A directed graph or digraph is a graph in which edges have orientations. It is written as an ordered pair $G=(V, A)$ (or $G=(V, E)$) with V being a set whose elements are called vertices (also called nodes or points) and A (or E) being a set of ordered pairs of vertices, called arrows (or directed edges). An arrow (x, y) is considered to be directed from x to y; y is called the head and x is called the tail of the arrow; y is said to be a direct successor of x and x is said to be a direct predecessor of y. If a path leads from x to y, then y is said to be a successor of x and reachable from x, and x is said to be a predecessor of y. The arrow (y, x) is called the inverted arrow or reverse edge of (x, y).

The vertices belonging to an edge are called the ends or end vertices of the edge. A vertex may exist in a graph and not belong to an edge. Two edges of a graph are called adjacent if they share a common vertex. Two arrows of a directed graph are called consecutive if the head of the first one is the tail of the second one. Similarly, two vertices are called adjacent if they share a common edge (consecutive if the first one is the tail and the second one is the head of an arrow), in which case the common edge is said to join the two vertices. An edge and a vertex on that edge are called incident.

A directed acyclic graph (DAG), is a finite directed graph with no directed cycles. That is, it consists of finitely many vertices and edges, with each edge directed from one vertex to another, such that there is no way to start at any vertex v and follow a consistently-directed sequence of edges that eventually loops back to v again. Equivalently, a DAG is a directed graph that has a topological ordering, a sequence of the vertices such that every edge is directed from earlier to later in the sequence.

A vertex v of a directed graph is said to be reachable from another vertex u when there exists a path that starts at u and ends at v. As a special case, every vertex is considered to be reachable from itself (by a path with zero edges). If a vertex can reach itself via a nontrivial path (a path with one or more edges), then that path is a cycle, so another way to define directed acyclic graphs is that they are the graphs in which no vertex can reach itself via a nontrivial path.

For a vertex, the number of head ends adjacent to a vertex is called the indegree of the vertex and the number of tail ends adjacent to a vertex is its outdegree (which may be called its branching factor in a tree). A node with indegree zero may be referred to as a root node, and a node with outdegree zero may be referred to as a leaf node.

A given edge may be assigned a weight, which in turn may be used to search for a weighted shortest path. In various embodiments, weights may be assigned to graph edges based on the fidelity measures discussed herein. For example, the weight of an edge may be computed based on the difference between fidelities corresponding to its connected vertices.

Various graph search algorithms may be used in various embodiments. Such search algorithms include, but are not limited to Dijkstra's algorithm, A* search, breadth-first search, depth first search, depth-first branch-and-bound search, iterative deepening A* search, and parallel depth-first search.

In addition, in various embodiments, a randomized graph search is applied. Suitable randomized graph search algorithms include, but are not limited to simulate annealing, nested annealing, parallel tempering, and genetic optimization. In such randomized graph search algorithms, a cost may be assigned to a given branch of the graph being searched. Subject to the parameters of the particular randomized graph search method, the cost is minimized (or maximized). In some embodiments, the cost simply corresponds to the weight of the edge leading to a branch. In some embodiments, the cost of a branch is assigned by performing a search of the branch, as set out in further detail below. Accordingly, in various embodiments, the cost is a real value that depends on the allocation represented by a given branch as well as the particular circuit being allocated.

Figure 4:
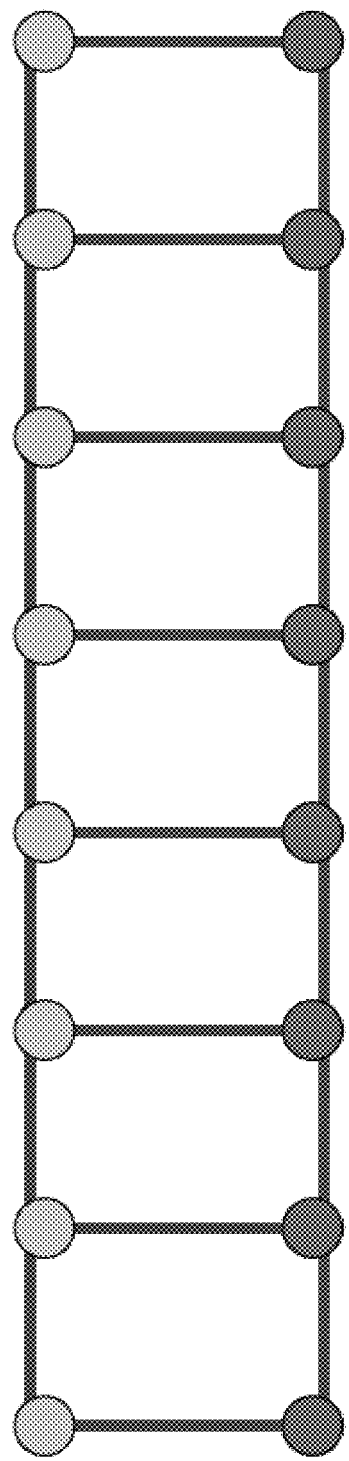
FIG. 4 is a connectivity graph of a first exemplary quantum computer.
Figure 5:
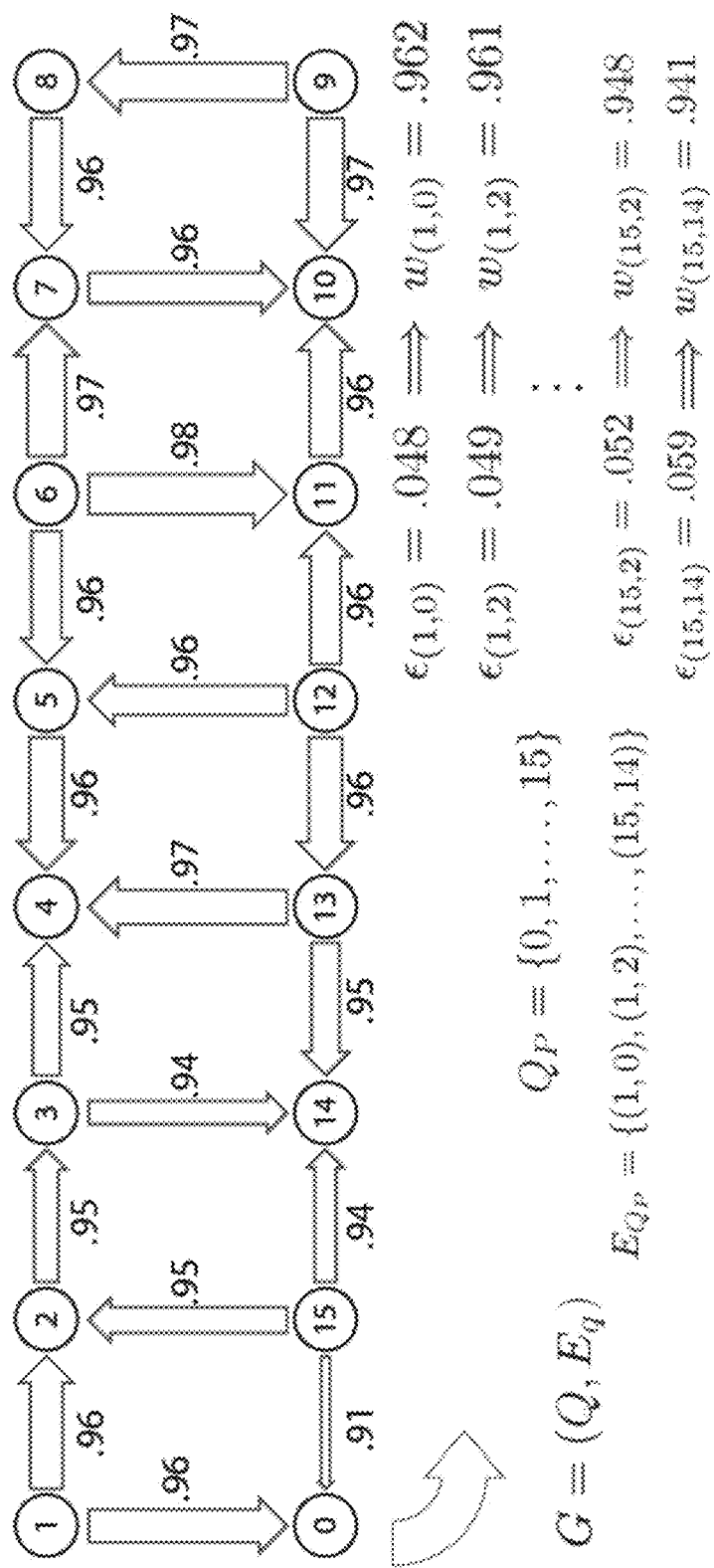
FIG. 5 is a fidelity graph of the first exemplary quantum computer.
Figure 6:
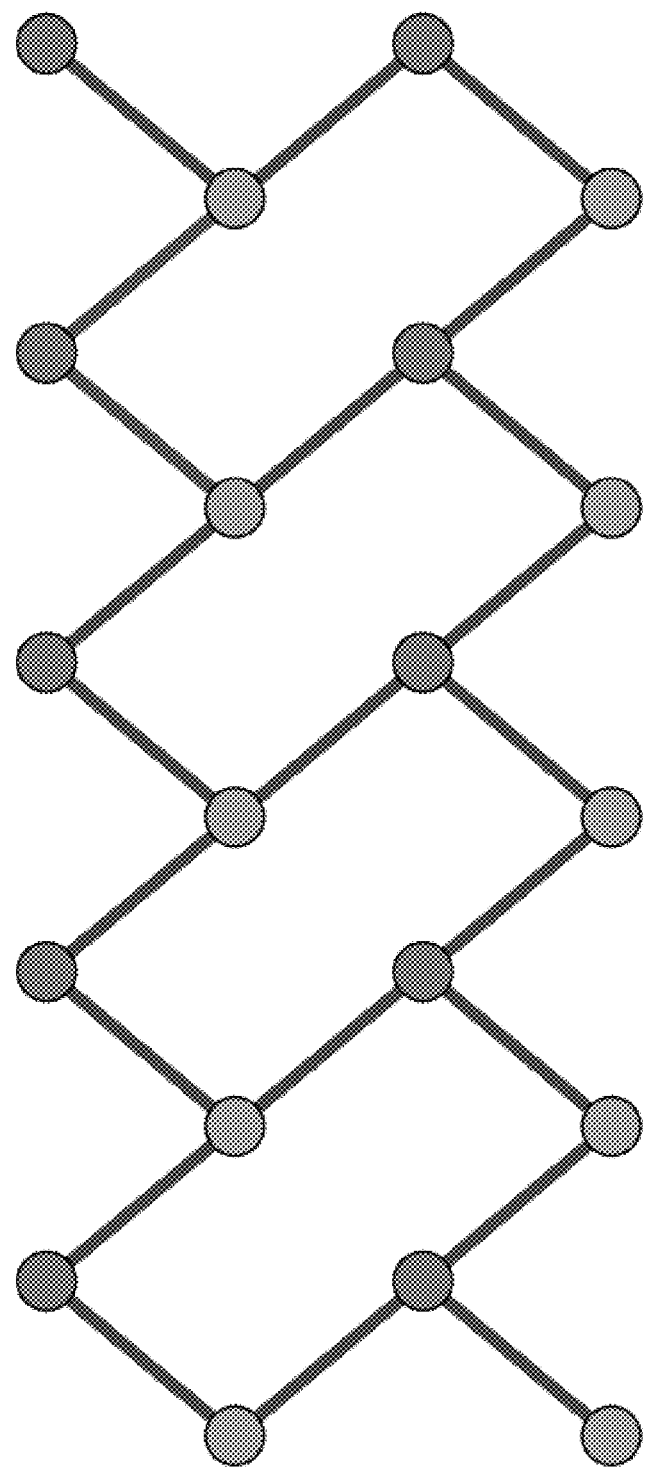
FIG. 6 is a connectivity graph of a second exemplary quantum computer.

Referring to FIGS. 4-6, exemplary connectivity graphs and fidelities are illustrated. FIG. 4 shows the lattice structure of IBM Q16 Rüschlikon. FIG. 5 shows exemplary corresponding fidelities and coupling. FIG. 6 shows the lattice structure of the Rigetti Acorn 19Q.

Since most existing quantum computers use the superconducting qubit archetype, these systems are only able to execute two-qubit gates on those qubits that are immediately connected. Examples of such quantum computers can be seen in FIGS. 4 and 6, where each node on the schematic represents a physical qubit and each edge represents a viable connection between two physical qubits.

To graphically represent these different systems, Q denotes the set of physical qubits on the hardware, and $E_q$ is the set of edges connecting the physical qubits. The coupling graph is then defined as $G_q = (Q, E_q)$ to provide a graph representation of a hardware device.

All edges $e \in E_q$ have an associated fidelity $w_e = 1 - \epsilon_e$. The error rate $\epsilon$ of an edge e, ranging from 0 to 1, is calculated during device calibrations, which may be occasionally established because there is variation in the error rates of different qubits and edges over time.

Following this definition, $w_e$ represents the reliability or fidelity of a two-qubit gate when applied to the two physical qubits associated with the edge e.

The total fidelity of the computation as the product of all fidelities of $N_1$ single-qubit gates and $N_2$ two-qubit gates that are applied on the physical hardware devices during runtime of the quantum program, as shown in Equation 3. In general, two-qubit error rates are one magnitude higher than single qubit error rates, and the total error rate is therefore dominated by the two-qubit error rates.

$$\mathcal{F}_{tot} = \prod_{i=1}^{N_2} \mathcal{F}_i^{(2)} \times \prod_{j=1}^{N_1} \mathcal{F}_j^{(1)} \qquad \text{Equation 3}$$

Because of connectivity constraints of current superconducting qubit archetypes, two-qubit operations, such as CNOT gates or Controlled PHASE gates, can only be performed on adjacent qubits on the hardware graph. Thus, if a two-qubit gate is to be performed on qubits that are not adjacent, the compiler must introduce SWAP instructions into the program so that the data of the two desired qubits will be adjacent on the hardware before the operation is performed.

One of the benefits of quantum computers that have any-to-any qubit layouts, that is, a complete graph schematic, is that no additional SWAP instructions are necessary during circuit compilation/optimization as all qubits are already connected to one another. However, for coupling graphs that are not complete, the present disclosure allows for efficient allocation of qubits.

SWAP minimization is of the sub-problems that needs to be accounted for when finding an optimal qubit allocation. It is a necessary part of the compiler because on existing hardware chips, certain circuits require the introduction of SWAP gates in order for them to be executed.

Where $\Psi$ is a list of all the two-qubit gates (control relations) between logical qubits in a given quantum circuit, the decision version of the SWAP Minimization Problem is defined as:

Input: Given a coupling graph $G_q = (Q, E_q)$, a list $\Psi = (P \times P)^n$, $n \geq 1$ of n control relations between logical qubits, and an integer $K \geq 0$.

Output: YES if we can use up to K SWAPs to produce a version of W that complies with the constraints of $G_q$.

Via reduction to the NP-Hard Token Swapping Problem, the SWAP Minimization Problem is in fact NP-Complete. The algorithms described herein take this into account and seek to minimize the total number of additional SWAP instructions required to run the circuit. However, while the number of SWAPs in a circuit strongly affects the total fidelity of the computation, it is not the only factor the compiler should consider when allocating logical qubits. For example, it must also consider the effects of the fidelities $w_e$ of the edges in the coupling graph, or the repeated clauses in $\Psi$ (if certain subsets of logical qubits have many control dependencies with one another, it should effect where those qubits are placed on the hardware).

There are two obstacles that compilers face when tailoring the input circuit to a non-fully connected hardware device: 1) the connectivity between two specific qubits is physically not possible (illegal) on the hardware; 2) the direction of a CNOT gate in the circuit is illegal on the hardware.

The second case refers to cases, where a physical connection between physical qubits a and b exist, but not between b and a, and the circuit contains a CNOT instruction with b as the control and a as the target.

More generally, a non-fully connected hardware device may have a constraint imposed on the direction of any two-qubit gate. In this case, a physical connection between physical qubits a and b exist, but not between b and a, and the circuit contains a two-cubit gate with b as the control and a as the target.

Whereas these obstacles can be surpassed through manipulation and adjustment to the hardware itself, a common and less resource-intensive solution is for the compiler to introduce certain circuit transformations.

To deal with the first obstacle, a solution provided herein is to use a series of SWAP gates to exchange the states of qubits until the two desired qubits are adjacent. Because the additional overhead of SWAPs are costly, especially for sparse coupling graphs, to find an optimal qubit allocation the SWAP Minimization Problem needs to be solved. Specifically, to perform a CNOT on two qubits that are not adjacent in the coupling graph, the overhead cost of the circuit transformation (excluding the cost of the CNOT itself) is defined as in Equation 4 where m is the number of intermediate qubits on the shortest path from the control qubit to the target qubit and $cost_{SWAP}$ is calculated as the cost of 3 CNOTs and 4 H gates. In qubit allocation algorithms provided herein, this cost is minimized by finding shortest SWAP paths between qubits and minimizing the number required SWAP instructions overall.

$$\text{cost} = 2m^* \text{cost}_{SWAP} \qquad \text{Equation 4}$$

Figure 7:
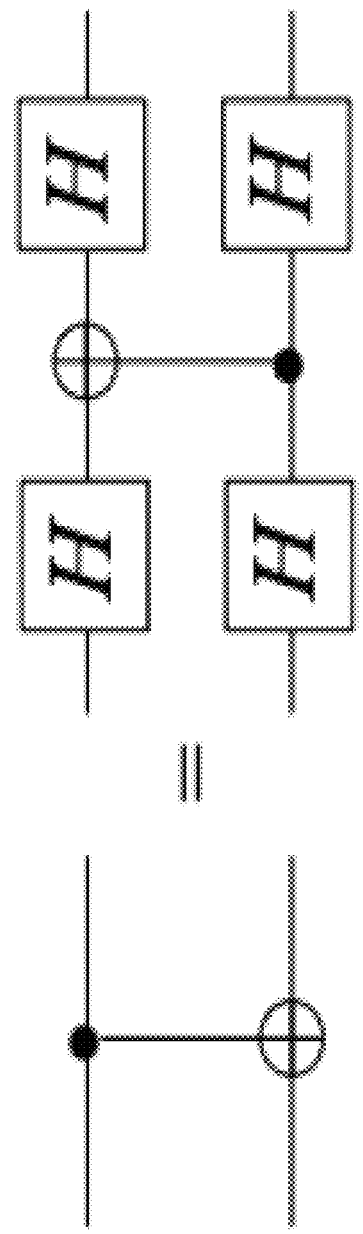
FIG. 7 a schematic view of decomposition of a reversal operation.

For the second obstacle, a solution provided herein is to insert a REVERSAL operation to flip the direction of the CNOT. The decomposition of the reversal can be seen in FIG. 7.

Even though the connection may not physically exist on the device, the CNOT can still be executed by using the connection in the reverse direction. Thus, in algorithms provided herein directed coupling graphs that are not fully connected are accounted for. In a preprocessing step, these reverse edges are added to the coupling graph with their respective fidelities calculated via the gate decomposition above. In this way, the algorithm can consider these pseudo-edges as viable connections even though they do not physically exist. These circuit transformations facilitate solution of the Qubit Allocation Problem.

The Qubit Allocation Problem subsumes the SWAP Minimization Problem and the Qubit Assignment Problem, both proven to be NP-Complete problems, so it is unlikely that there exists a polynomial-time algorithm for finding the exact solution. An exact solution may be provided via a dynamic programming algorithm, but its time complexity is of the order $O(|Q|!^2 \times |Q| \times |\Phi|)$ where Q is the set of physical qubits on the device and $\Phi$ is the list of control relations in the input circuit. This exact solution scales exponentially in the number of physical qubits on the hardware, as well as in the number of control relations in the circuit, thus creating the need for more time-efficient qubit allocation algorithms for larger hardware graphs and circuits.

A brute-force A* algorithm is provided below that searches through all possible allocations and chooses the one that will have the lowest associated cost when executed on the specified quantum device.

Optimal solutions to the qubit allocation problem are prohibitively expensive, so toolchains for quantum computing must rely on heuristics and approximate solutions. Various approaches provided herein begin by removing swap placement from consideration to simplify the considered solution space. In the general qubit allocation problem, optimal solutions may contain swaps that are not necessary to satisfy the constraints of the problem.

For example, consider a hypothetical device with its qubits organized into two groups, A and B. Imagine that the physical qubits in group A have very high fidelity when executing some gate a and low fidelity when executing some other gate b, and the qubits in group B have high fidelity for b and low fidelity for a. Furthermore, imagine that all swaps on this device have very high fidelity.

For a quantum circuit that contains many a gates followed by many b gates, it would make sense to initially allocate the circuit's logical qubits to group A for the executions of a and swap them over to group B before the executions of b. These swaps may not be necessary to satisfy the connectivity constraints of the program, but for this hypothetical physical device and program, the swaps would be important for maximizing fidelity.

However, at present, no quantum device has either the asymmetries in fidelity between different sets of qubits for different operations or the cheap swaps that would be necessary to make considering eager swap placements worth the additional algorithmic complexity it requires. Accordingly, in some embodiments, swaps are inserted lazily, as late as possible and only when they are necessary to satisfy connectivity constraints. This simplification makes the set of necessary swaps for some starting qubit allocation computable in time linear with the size of the program. Since the swaps are efficiently computable from allocations, all a qubit allocation algorithm with lazy swap insertion has to do is find a starting allocation, which is much simpler than searching for both the starting allocation and a full set of swaps, as in the full qubit allocation problem. In various embodiments, set out below, algorithms are provided that find the optimal solution to the problem of qubit allocation with lazy swap insertion.

Figure 8:
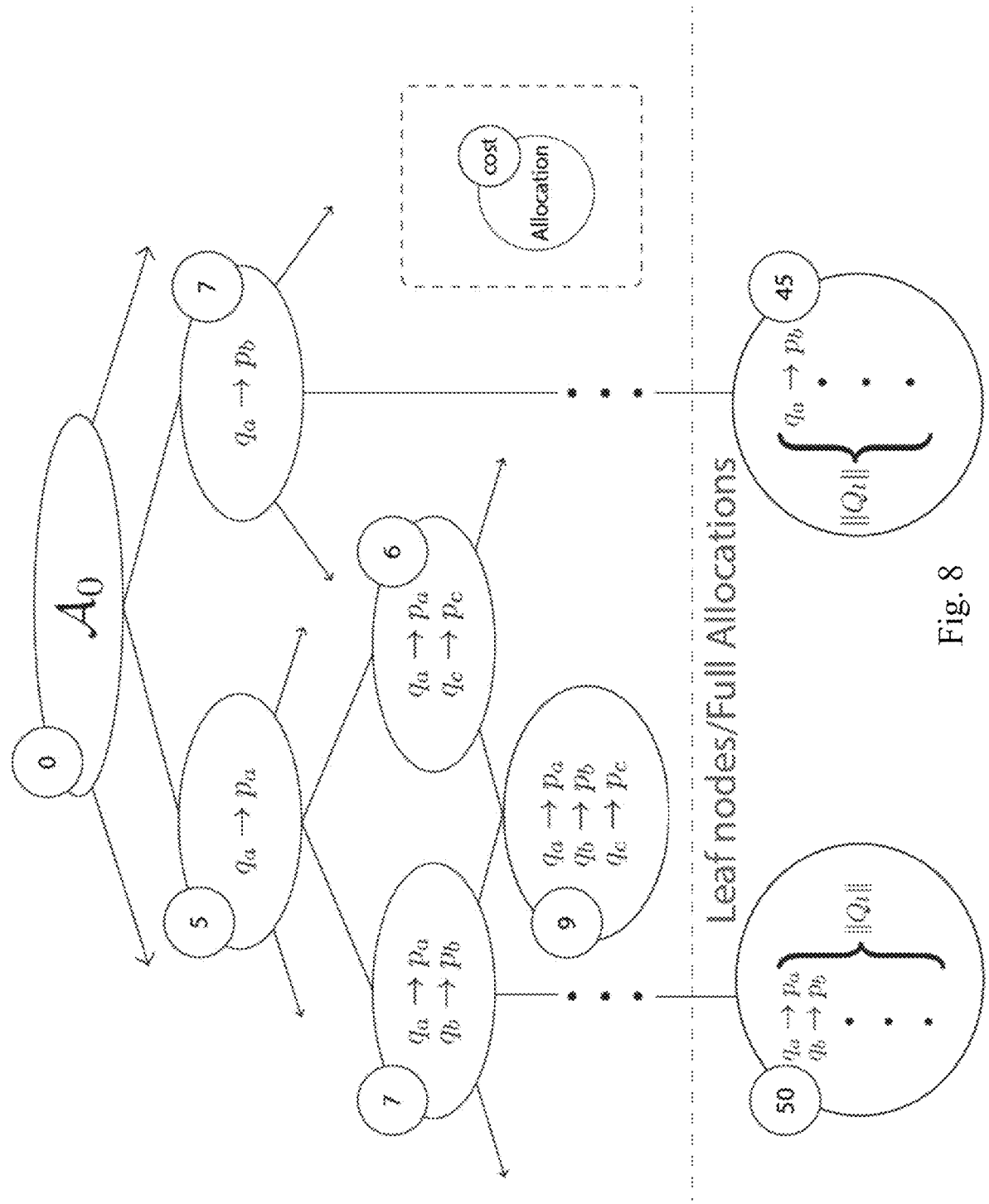
FIG. 8 is an exemplary directed acyclic graph of qubit allocations according to embodiments of the present disclosure.

Referring to FIG. 8, a directed acyclic graph is illustrated, as constructed in a local search algorithm according to embodiments of the present disclosure. As set forth below, the set of vertices of $G_{P,D}$ is the set of all possible allocations, including partial allocations, for the quantum program P and device D. As used herein, the term allocation refers to a mapping of a subset of the logical qubits to a subset of the physical qubits, where the subset may be the empty subset (an empty allocation), a subset equal to the set (a complete allocation), or an intermediate sized allocation (a partial allocation). The root of $G_{P,D}$ is the empty allocation, and every vertex is a sub-allocation of all other vertices reachable from it. Edges represent the extension of allocations by a single additional qubit mapping. Furthermore, $G_{P,D}$ is acyclic because every vertex in $G_{P,D}$ is strictly larger than each of its predecessors, and a vertex is a leaf if and only if it is a full allocation.

The problem of qubit allocation with lazy swap insertion can be reduced to the problem of finding the shortest weighted path in a directed acyclic graph (DAG). Let an allocation A be a mapping of some set of logical qubits $Q_A$ in a program P to distinct physical qubits of a device D. The size of an allocation A is $\|A\|=\|Q_A\|$. The empty allocation $\epsilon$ is the allocation for which $\|\epsilon\|=0$, and a full allocation for P is any allocation A such that $Q_A$ is the set of all logical qubits in P. In addition, a suballocation relation, $\sqsubset$, is defined such that for allocations A and B, A $\sqsubset$ B if and only if every mapping in A is also present in B.

Now consider the directed graph $G_{P,D}$ with the set of all allocations for program P and device D as the set of vertices and the set of all pairs of allocations (V, V') such that $\|V\|+1=\|V'\|$ and V$\sqsubset$V' as the set of edges. $G_{P,D}$ is acyclic because every vertex in $G_{P,D}$ is strictly larger than its predecessors, so $G_{P,D}$ is a DAG. Each path from E to a full allocation F in $G_{P,D}$ represents a sequence of decisions to allocate single qubits that together form a full allocation, so $G_{P,D}$ represents every possible way to create a full allocation starting from nothing. To arrive at the optimal full allocation, a path needs to be found that leads to it. By constructing edge weights in $G_{P,D}$ appropriately, it can be ensured that the weighted shortest paths end at the full allocation with the highest fidelity, so shortest path algorithms may be used to find the optimal solution.

To calculate the weight of an edge, first consider an upper bound on the fidelity of the program under some partial allocation. The fidelity of the program is the product of the fidelities of the gates that are executed during an execution of the program, including all inserted swaps. Under some partial allocation, a gate in general operates over some number of allocated qubits and some number of unallocated qubits. An upper bound on the fidelity of the gate under the allocation in question can be obtained by choosing the best possible physical qubits for the unallocated logical qubits without worrying about satisfying the connectivity or uniqueness constraints. The product of these gate fidelity bounds over all the gates in the program is an upper bound on the fidelity of the program. When the allocation is full, this bound is exact.

Let $F_A$ be this upper bound on program fidelity under allocation A. Now consider the weight of edge (A, B) to be $F_A$-$F_B$. By the definition of edges in $G_{P,D}$, B contains every qubit allocation in A plus one more. This additional allocated qubit tightens the calculated upper bound on the fidelity of gates involving it and may also increase the number of inserted swaps. Therefore $F_B$ must be less than $F_A$ and the edge weight must be positive. It will be appreciated that associating a weight with each edge corresponding to this fidelity difference is equivalent to providing a weight to each node corresponding to these fidelities, and that implementations using either approach are within the scope of the present disclosure.

The weight of a path from vertex S to vertex T in $G_{P,D}$ is the sum of the edges in that path, which collapses to $F_S$-$F_T$. Therefore, the shortest weighted path of length n starting from S ends at the allocation T' whose upper fidelity bound is closest to that of S. If S is the empty allocation and n is the number of logical qubits, then T' is the full allocation with the highest fidelity. The problem of optimal qubit allocation with lazy swap insertion is thereby reduced to the problem of finding the shortest path in a weighted DAG with positive edge weights. This problem can be solved by multiple algorithms, such as Dijkstra's algorithm.

As an optimization, the number of paths to be searched in the DAG can be reduced. Notice that all paths between two vertices in $G_{P,D}$ have the same weight. This is because the upper bound on the fidelity of an allocation does not depend on the order of qubits allocated in its construction. To solve the optimal qubit allocation with lazy swap insertion problem, it suffices to have a single path to the optimal full allocation. This can be achieved by fixing the order in which qubits are allocated, turning the $G_{D,P}$ into a tree $G'_{D,P}$ with maximum degree |D| rather than |D||P|. Which order the qubits are allocated in does not matter for correctness, but it can matter for execution time. This implementation heuristically allocates logical qubits in order from most to least constrained to reduce the time it takes to discover that an initial allocation choice is infeasible.

In the worst case, when all possible allocations have the same fidelity, Dijkstra's algorithm is equivalent to a breadth-first search. For a device with Q physical qubits, the number of possible allocations of size n is $$\frac{Q!}{(Q-n)!} \quad \text{Equation 5}$$

Therefore, the number of edges traversed in the worst case for a program with N logical qubits is $$\sum_{n=1}^{N} \frac{Q!}{(Q-n)!} \quad \text{Equation 6}$$

This algorithmic worst-case behavior is unsuitable, but current devices do not exhibit these worst-case properties. Djikstra's algorithm will not consider any vertex whose fidelity bound is lower than the true optimal fidelity, so in practice the algorithm might only visit a very small portion of the solution space before finding the optimal solution. For all allocations to have the same fidelity, either a device's qubit connectivity graph must be complete and all of its couplings must have the same fidelities, or the connectivity graph of the logical qubits must be symmetric. NISQ devices are sparsely connected and have non-uniform qubit fidelities, so in practice only symmetric programs lead to excessive runtimes.

The existence of programs that can deterministically trigger the exponential worst-case behavior of this algorithm make it unfit to serve as a full general solution, particularly as a service that might be run on untrusted inputs. However, this algorithm is still useful as a component of a complete solution. Consider that the graph search can start from any arbitrary partial allocation, not just the empty allocation. On each step of the search rooted at a particular partial allocation, the upper bound on the fidelity achievable by that partial allocation is tightened. A tradeoff can therefore be made between time and tightness of this upper bound.

This tradeoff can be exploited to create a tunable optimization procedure for generating full allocations that can trade time budget for solution quality.

As hardware is produced with an increasing number of qubits, it is desirable that a qubit allocation algorithm scale well both in the number of physical qubits on the hardware as well as in the number of logical qubits in the circuit. In various embodiments, randomization is introduced as a method of reducing the search space of the local search algorithm. Given the exponential run time of any exact solution to the qubit allocation problem, this provides an approximate solution in asymptotically less time. Specifically, various embodiments take a heuristic approach, using simulated annealing to generate progressively larger proposed partial allocations, and using the local search algorithm's cost function as the objective function during the annealing process.

Figure 9:
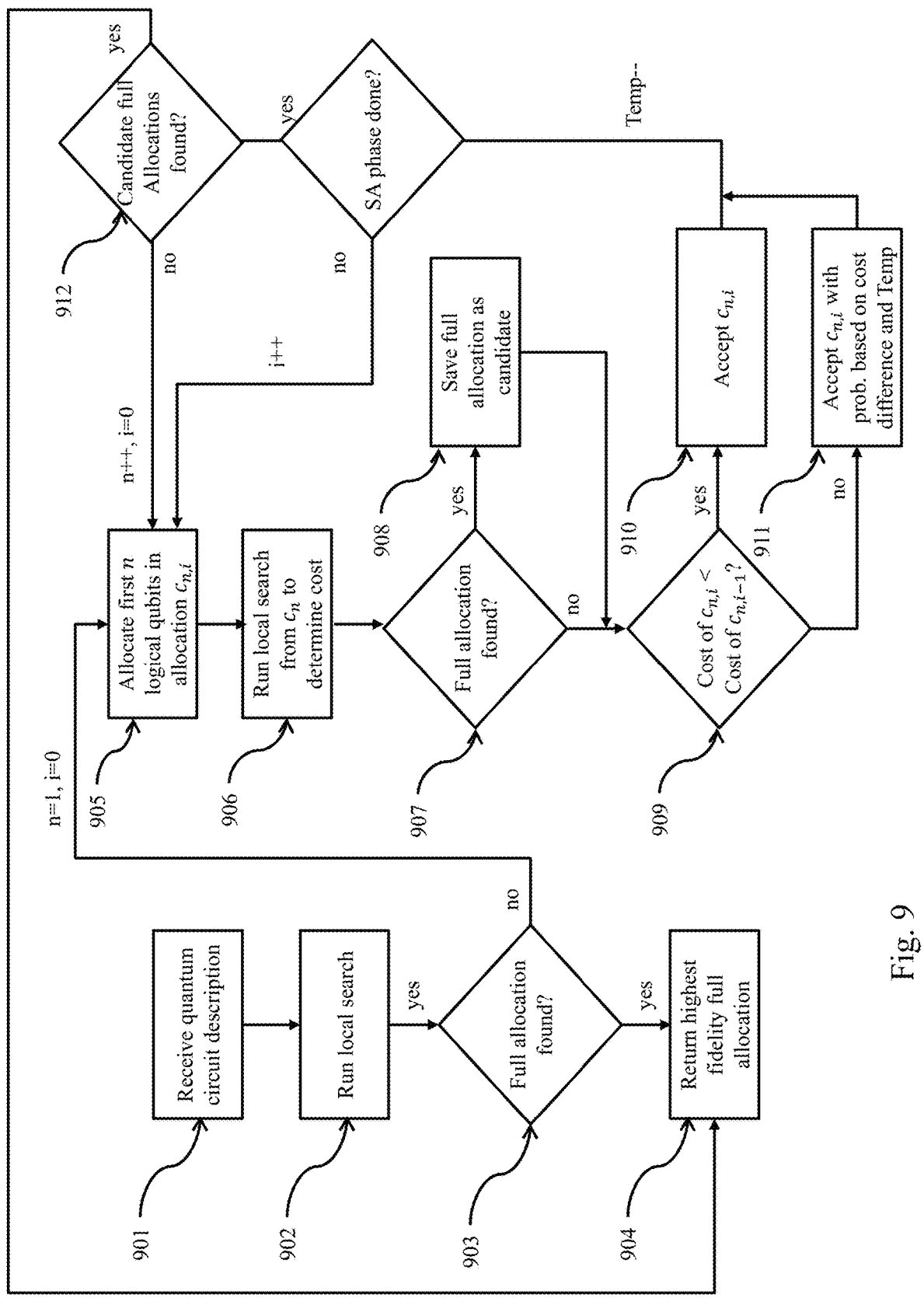
FIG. 9 is a flowchart illustrating a hybrid algorithm for qubit allocation according to embodiments of the present disclosure.

Referring to FIG. 9, a hybrid algorithm for qubit allocation is illustrated according to embodiments of the present disclosure. As used herein, the hybrid algorithm refers to a randomized search on the hardware graph using a local search algorithm, such as the one described above, as a guide. The hybrid algorithm is based on a simulated annealing approach, which progressively shrinks the problem that the local search algorithm is required to solve.

The hybrid algorithm receives a quantum circuit description (901), and finds a full allocation by first selecting progressively larger sub-allocations. Qubits are greedily allocated one at a time with simulated annealing (905 . . . 912), using the local search (906) for a fixed number of steps as an objective function to estimate the associated cost of each proposed sub-allocation in the annealing process. If a proposed sub-allocation has a lower cost than the current sub-allocation (909), it is accepted (910) as a better starting point for the local search and the process continues (905).

If it has a higher cost, then it is accepted with a probability dependent on the cost difference (911), in order to avoid getting stuck at a local minimum. Simultaneously, if the local search happens to find a full allocation (907) within that number of steps, this allocation is returned (912) rather than continuing with the annealing process.

Thus, in the hybrid algorithm, the local search serves the dual purpose of finding accurate cost estimations as well as searching for full allocations, within a fixed number of steps given as a parameter. This STEPS parameter gives the user flexibility to control the trade-off between total circuit fidelity and time spent on allocation. As the STEPS parameter increases, this means that the local search can process more nodes in the queue each time it is called, thus giving more accurate cost estimates for the proposed sub-allocation as well as an increased chance that the local search finds a full allocation, taking the sub-allocation as fixed.

Initially, the local search algorithm is called (902) for STEPS steps on the full problem with no partial allocation passed in, essentially seeing if the local search can find the optimal allocation without the need for randomization to reduce the problem size. If this search fails (903), simulated annealing (905 . . . 912) is used to allocate a single logical qubit. Simulated annealing proposes potential allocations (905) for this qubit and uses local search (906) to measure the expected cost of a full allocation with the proposed sub-allocation fixed. The algorithm continues in this way, adding one qubit at a time to the annealing search. Each time local search is called to measure the cost, it is also searching for potential full allocations based on the proposed allocation as a fixed sub graph, because as the local search runs, it updates its cost each step. Before adding another qubit to the simulated annealing search, it is checked whether any full allocations have been found (912). If local search has found at least one full allocation, the full allocation with the highest fidelity is returned (904).

The pseudocode for the hybrid algorithm is as follows:
Inputs: 1) A quantum circuit in OpenQASM or QUIL format; 2) Specifications of the hardware. This includes single qubit gate, two-qubit gate, and readout error rates.
Output: An equivalent quantum circuit in OpenQASM or QUIL that is tailored to the given hardware device with logical qubits allocated and SWAP operations introduced.
Parameters: STEPS—the number of steps the Local-Search algorithm will take on each call; TEMP—initial temperature for the SimulatedAnnealing algorithm which affects how many partial allocations are processed for each iteration of the outer loop; QubitOrder—the order in which the logical qubits will be allocated.

---
Inset 1
---

Run LocalSearch on full problem for STEPS steps
if LocalSearch finds a full allocation a then return a
else
    for n in 1 to N (number of logical qubits) do
        candidates=[ ]
        for each step in SimulatedAnnealing do
            Propose a partial allocation c allocating the
                first n logical qubits of QubitOrder
            cost(c) ← run LocalSearch for STEPS steps
                passing in c as a fixed sub-allocation
            Decide to accept or reject c for next iteration
                of SimulatedAnnealing based on cost(c)
            if LocalSearch finds a full allocation f then
                append f to candidates
            end if
        end for
        if candidates is nonempty then
            return lowest-cost allocation in candidates
        end if
    end for
end if

---

The order in which qubits are greedily allocated is important as it affects the performance of the local search (when bounded), so the present disclosure provides a method for finding a well-performing qubit ordering, detailed in the discuss of local search, above.

It will be appreciated that a search on the allocation graph may return more than one leaf node (corresponding to multiple full allocations), depending on the parameters of the search. Local search is run to return the one leaf node corresponding to the weighted shortest path. However, as described above, a randomized approach is used in various embodiments for larger circuits/hardware due to prohibitive runtime of the exhaustive search. In various embodiments, the randomized approach provides several candidate leaf nodes that are close to the optimum. In such cases, the overall algorithm can return either the lowest cost of these candidates or the whole set of candidate leaf nodes.

It will be appreciated that fidelity may be determined in a variety of ways. It may be estimated based on the performance of a particular quantum computer. It may be provided by a vendor for a given quantum computer, and thus known a priori. It may also be estimated through various heuristic methods.

Figure 10:
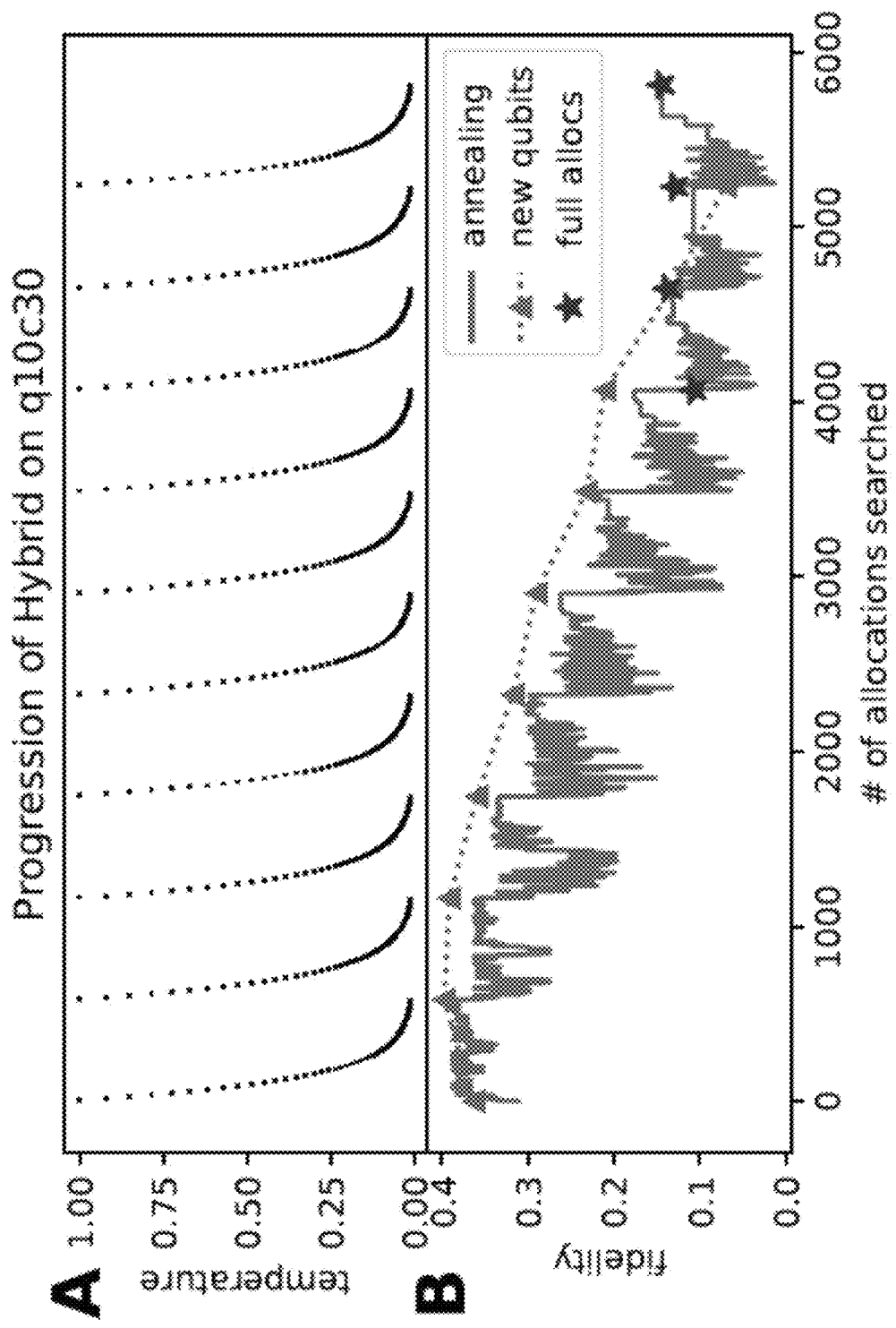
FIG. 10 is a chart of temperature and fidelity relative to allocations searched according to embodiments of the present disclosure.

Referring to FIG. 10, a chart of temperature and fidelity relative to allocations searched is provided to illustrate the execution of a hybrid algorithm on a randomly generated 10-qubit, 30 CNOT Quil circuit called q10c30 with n=5, $T_0=1$, and $\tau=12:5$. FIG. 10 shows the change in the temperature T as the simulated annealing routine explores allocations. The annealing data in shows the fidelity bounds of all the partial allocations the hybrid algorithm explores, adding one qubit for each round of annealing. Full allocations are denoted by a star.

The probability of accepting a sub-allocation with lower estimated fidelity depends on the current temperature that is define as $T=T_0\exp(-s/\tau)$, where s is the iteration counter within a simulated annealing process, $T_0$ the initial temperature, and the reduction of the temperature is given by $\tau$. When the temperature T is higher, it is more likely to accept worse proposed allocations and when it is lower only better or similar allocations are likely to be accepted. As a simulated annealing round progresses, the solution space is explored less and instead the best solution found so far is explored. This explains why there is a reduction in noise throughout each of the 10 annealing iterations in FIG. 10 as the respective temperatures decrease. Generally, a downward trend in fidelity bounds should be seen as new qubits are added to the search, because larger allocations have tighter upper bounds on total fidelity than smaller allocations. The simulated annealing process is easily parallelizable and can be run several times simultaneously.

As described below, the algorithms described herein achieve increased accuracy as compared to alternative approached. For example, various comparisons are provided below between local search and the faster hybrid solution, and tools provided through Rigetti Computing's PyQuil platform and IBM's Q Experience. These two compilers are available to the public for testing.

At present, there is no standard method for benchmarking the performance of quantum compilers, so several new approaches are provided below. The compilers are tested against randomly generated QUIL and QASM files, containing a set number of CNOT gates. These files are generated by writing CNOT operations between any two physical qubits selected uniformly at random. In the first test, the programs are run on IBM's Q 16 Rüschlikon device. Next, testing is performed against Rigetti's public compiler along the number of topological SWAP's inserted, a common metric described above.

In testing against IBM Q Experience, randomly generated CNOT circuits are run on IBM's publically available Rüschlikon device. As there is no agreed upon method for testing total circuit fidelity, a solution is provided herein. The testing framework is as follows: first a randomly generated circuit is created containing only CNOT gates. Next, this circuit is compiled into a device executable QASM file through three methods: IBM's public compiler, a local search allocator as described herein, and a hybrid algorithm as described herein with parameters STEPS=10 and TEMP=10.

Each of these compiled programs is run on IBM's hardware measuring one qubit at a time. This is done to avoid noise associated with measuring multiple qubits successively.

Since each circuit contains only CNOT gates, in principle the qubit measured should have 100% probability of being measured in the ground state. Therefore, if a qubit is measured in the excited state, this must be a product of device noise. So the error of a circuit is defined to be the number of total number of trials in which each qubit involved in the circuit is measured to be in the excited state. The percent error is the percentage of incorrect measurements in all trials of a circuit. To minimize noise associated with single qubit measurement, the circuit was run 1024 times for each qubit involved in the circuit, measuring the physical qubits one at a time.

Figure 11:
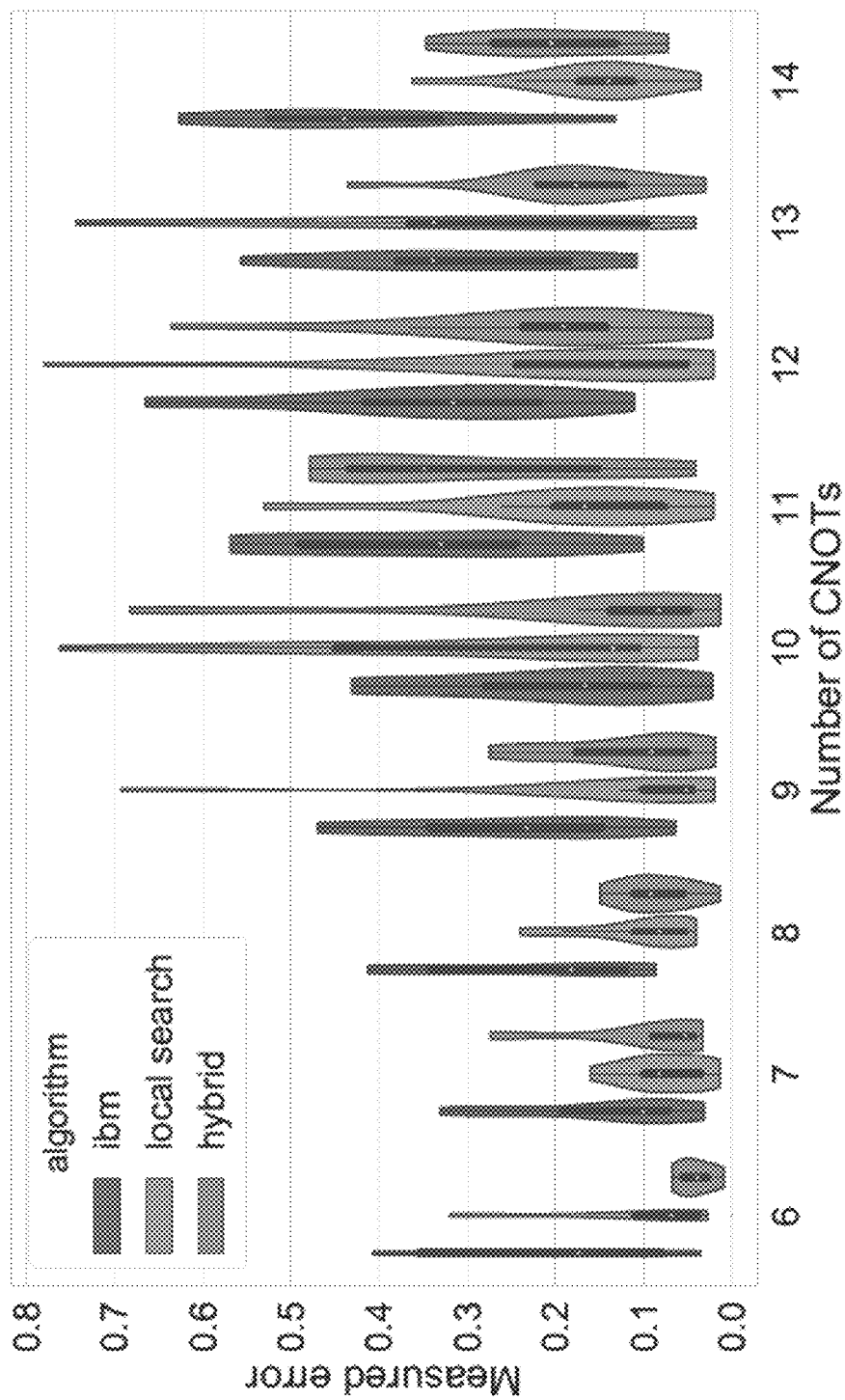
FIG. 11 is a graph of measured error relative to number of CNOTS of various allocation algorithms.

FIG. 11 is a graph of measured error illustrating the percentage of accurate measurements after compiling a series of randomly generated CX circuits on each method and running on IBM's Q 16 device.

These results show that the local search qalloc method consistently out-performs IBM's public compiler, resulting in more accurate measurements in every case. This advantage tends to increase as the size of the circuit increases. The hybrid algorithm tends in general to beat out IBM's compiler as well, though with more variability. These results demonstrate that device noise can be decreased by over a factor of 2 using pre-processing.

At the time of writing, Rigetti Computing's 19 Qubit device is unavailable for running live programs. However, their compiler is still available through the Forest API. For the purpose of these tests, the device specifications is used from when the Acorn 19Q was still operational.

As described above, a limiting factor in running abstract circuits on physical hardware is the need to introduce SWAP gates in order to achieve interactions between unconnected qubits. While the solutions provided herein focus on maximizing total circuit fidelity, swap-minimization is a byproduct of this goal. For this reason, the number of topological SWAP gates inserted by each compiler is used as a proxy cost function.

Circuits are again randomly generated, this time containing only CZ gates, the native 2-qubit gate for Rigetti's device. For these tests, the circuits are written in Rigetti's open source QUIL instruction language. The same circuit is passed to Rigetti's compiler as well as the local search algorithm to generate device-executable QUIL files. Finally, the number of topological SWAP gates that each method inserts into the program is compared.

Figure 12:
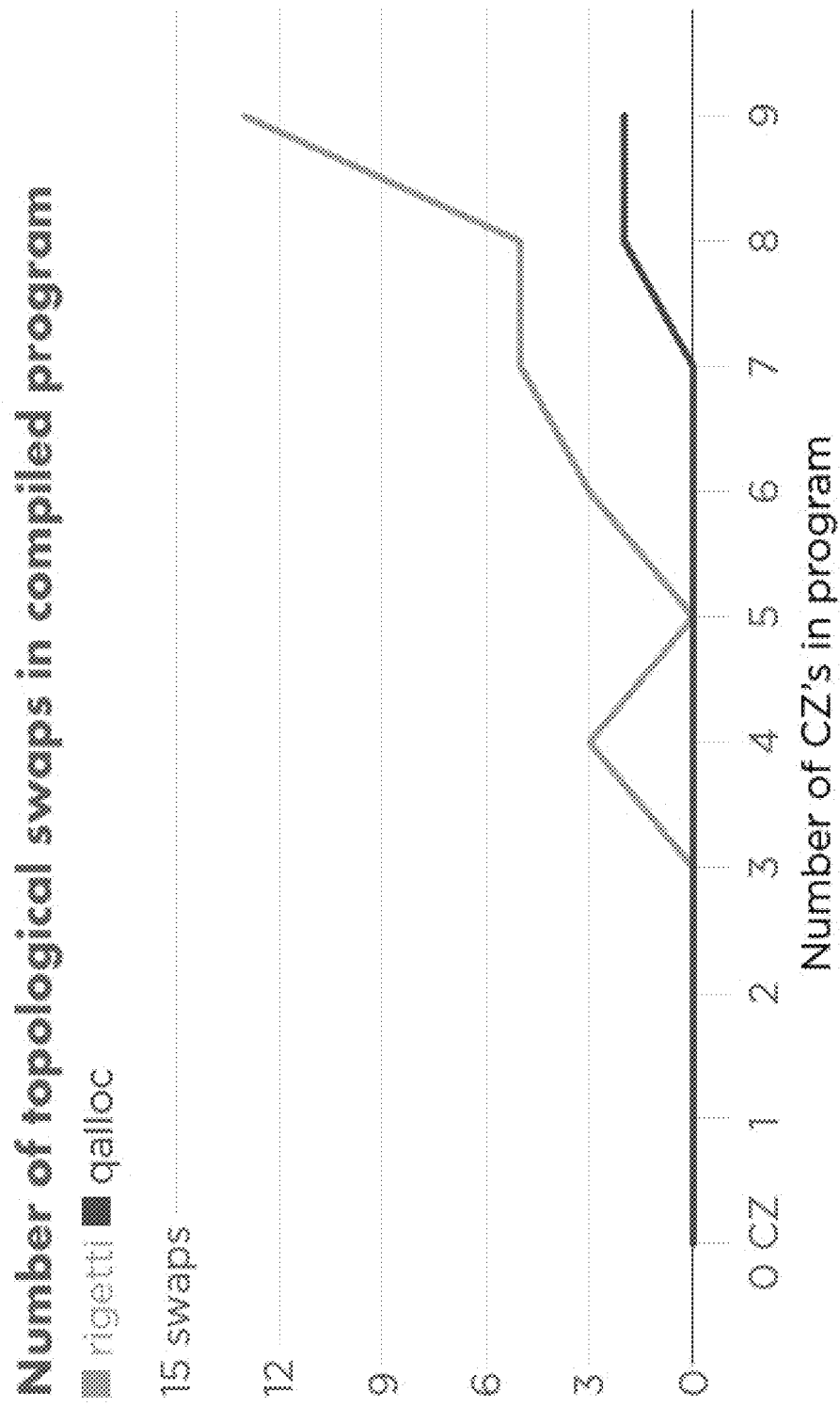
FIG. 12 is a graph of the number of topological SWAP gates inserted by various compilers on increasingly larger QUIL circuits.

FIG. 12 is a graph of the number of topological SWAP gates inserted by each compiler on increasingly larger QUIL circuits.

Again, these results show that the local search algorithm, qalloc, consistently beats Rigetti's public compiler. In every trial, qalloc inserts as many or fewer SWAPS than Rigetti's compiler. In fact, qalloc does not insert a single SWAP until reaching a circuit containing 8 two-qubit gates, while Rigetti's compiler first inserts SWAP's on a circuit containing 4 two-qubit gates. Further, qalloc's advantage increases as the number of two-qubit gates in the input circuit increases. On the largest trial tested, with 9 two-qubit gates, qalloc inserted two SWAP's while Rigetti's compiler inserted 13.

While this benchmark does not test the respective compilers' performance on real hardware, it is reasonable to assume that such a significant decrease in topological SWAP's would correspond with higher circuit accuracy.

NISQ-era computers will change the landscape of technology through their capability of solving complex computer science problems that classical computers are unable to solve efficiently. The NISQ era will unveil quantum computers with a number of qubits ranging from 50 to a few hundred. The qubit allocation algorithms provided herein can be used for compilation on these intermediate-scale devices. As the Qubit Allocation problem itself is NP-complete, the hybrid algorithm uses a smart, randomized search to reduce the problem size to save time while still obtaining a total program fidelity close to that of the optimal.

The parameters of the hybrid algorithm, STEPS and TEMP, allow the user (or the compiler itself) to choose the tradeoff between the time spent on allocation and total fidelity. Simply setting the STEPS parameter to 0 effectively tells the hybrid algorithm to find a full solution from solely simulated annealing, whereas setting STEPS to ∞ tells the hybrid to perform the LocalSearch algorithm until completion without any help from simulated annealing to reduce the search space.

The hybrid algorithm is flexible in several aspects. With parameters that control facets of graph exploration, probability, time, and fidelity of the allocation, users (and even smart compilers) can tune the algorithm's performance to suit their resource constraints in real-time. In addition, these algorithms are hardware-agnostic; meaning that they are functional for any given hardware graph representing a quantum computer's qubits and associated connectivity constraints. Differing physical implementations of quantum computing architectures (e.g., superconductors vs. ion traps) each have different respective connectivity constraints between qubits. The hybrid algorithm is hardware-agnostic as in it works for any hardware graph, but behind the scenes the code is very hardware-aware, meaning that the hardware's specifications and connectivity constraints are the factors that determine how the algorithm proceeds in deciding on a qubit allocation that minimizes the overhead for executing the given quantum circuit on the hardware. This dual nature of hardware-agnosticism and hardware-awareness provides a flexibility and sensitivity qualifying it as a practical tool for reducing the noise of quantum computation on NISQ-era computers.

Some examples of problems that are well suited to see a speedup from quantum devices can be found in the field of computational quantum materials. In this field, very advanced quantum mechanical calculations are required to simulate quantum materials such as strongly-correlated or chemical systems. These calculations involve finding solutions to the Schrödinger equation and are known to be exponentially hard to perform on a classical computer (the exponential wall of many-body problems). Exact treatment is therefore limited to small systems. Approximate treatments, for example those using density-functional theory, are often not adequate to satisfactorily solve strongly correlated systems, so alternative methods of computation are required. Since quantum computers exploit some of the intrinsic features of quantum mechanics, such as the concepts of superposition and entanglement, simulations of physical and chemical systems are prime candidates to benefit from these novel devices.

Figure 13:
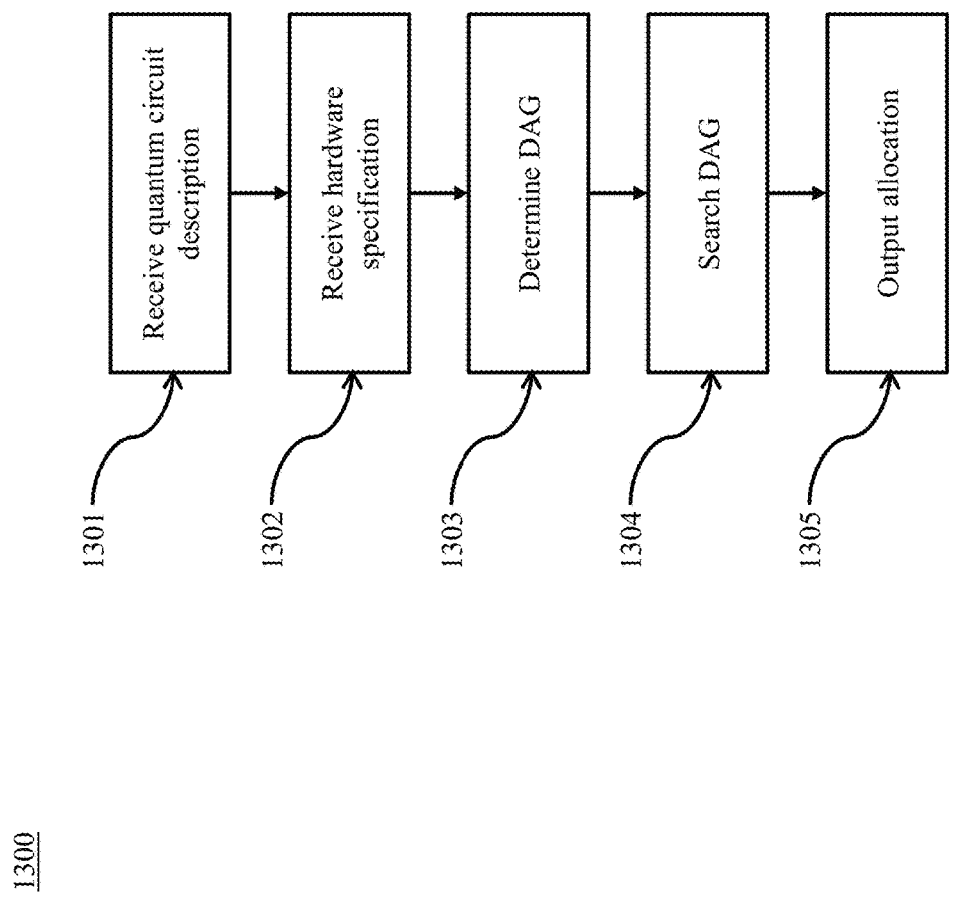
FIG. 13 illustrates a method for quantum problem compilation according to embodiments of the present disclosure.

Referring now to FIG. 13, a method for quantum problem compilation is illustrated. At 1301, a description of a quantum circuit is received. The quantum circuit comprises a plurality of logical qubits. At 1302, a hardware specification is received. The hardware specification comprises a connectivity graph of a plurality of physical qubits. At 1303, a directed acyclic allocation graph is determined based on the plurality of logical qubits and the connectivity graph. The allocation graph comprises a node for each possible allocation of the plurality of logical qubits to the plurality of physical qubits, each allocation having a fidelity, and a plurality of directed edges, each edge connecting to its corresponding first node from its corresponding second node, the first node corresponding to a first allocation, the second node corresponding to a sub-allocation of the first allocation. At 1304, the allocation graph is searched for a weighted shortest path from a root node of the allocation graph to a leaf node of the allocation graph. At 1305, the allocation corresponding to the weighted shortest path is outputted.

Figure 14:
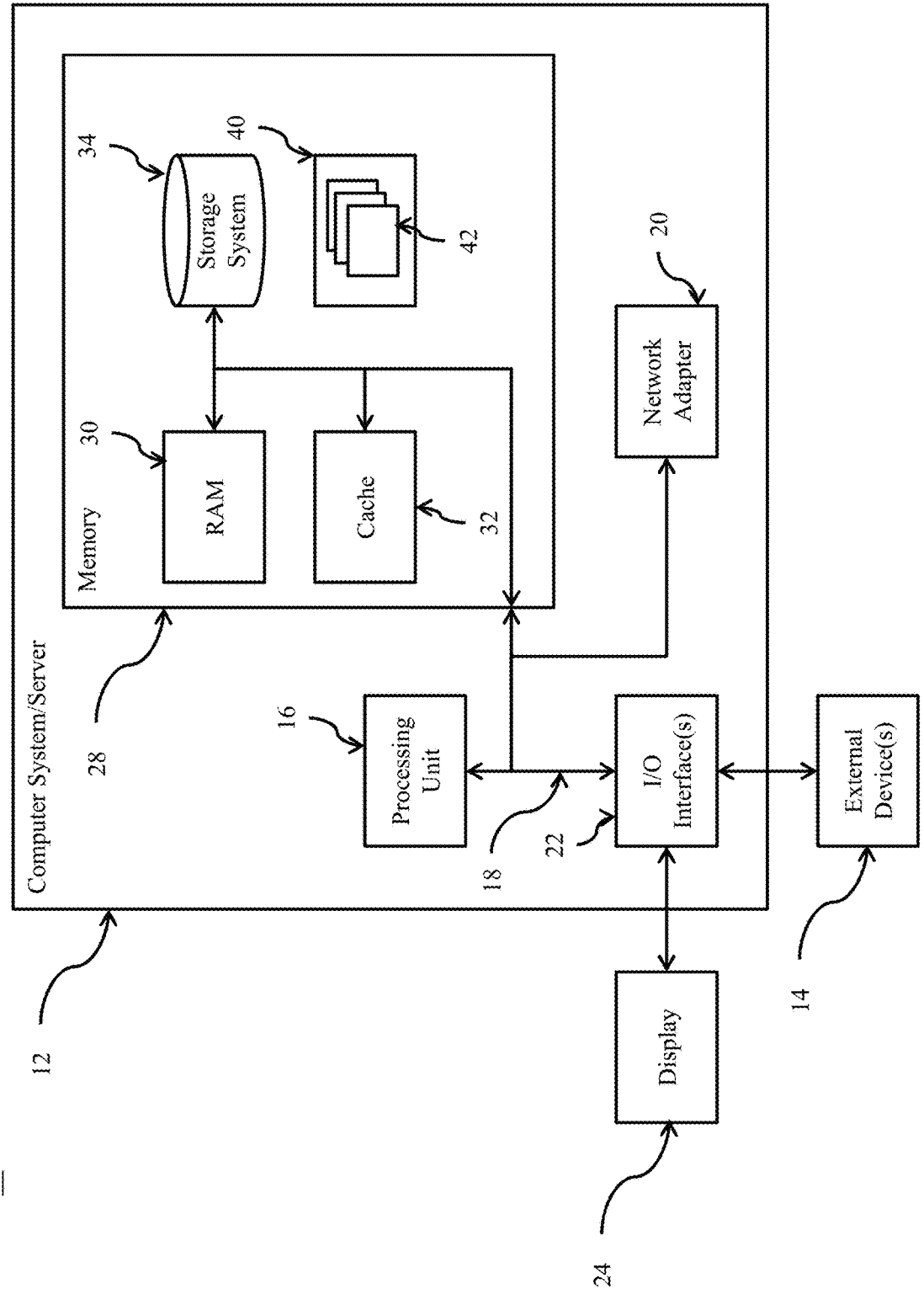
FIG. 14 depicts a computing node according to an embodiment of the present disclosure.

Referring now to FIG. 14, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
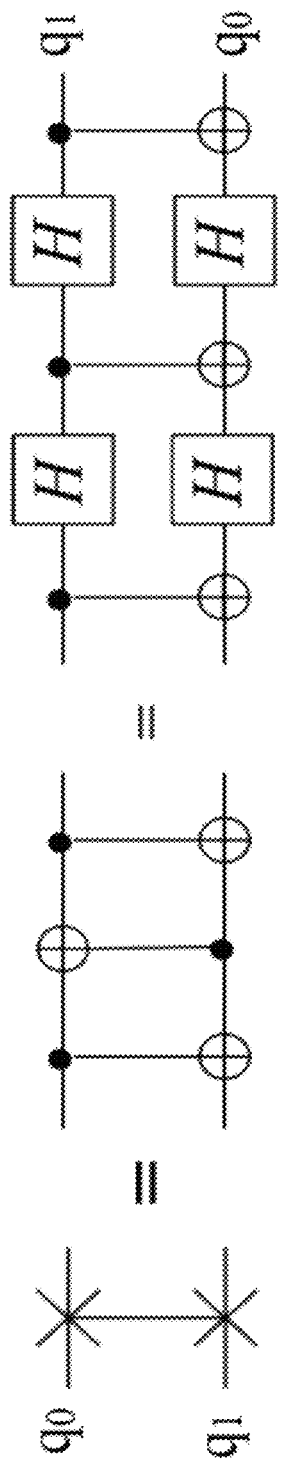
FIG. 2 is a schematic view of decomposition of a SWAP gate applied to two immediately connected physical qubits.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of quantum problem compilation, comprising:
- receiving a description of a quantum circuit, the quantum circuit comprising a plurality of logical qubits;
- receiving a hardware specification, the hardware specification comprising a connectivity graph of a plurality of physical qubits;
- determining a directed acyclic allocation graph based on the plurality of logical qubits and the connectivity graph, wherein the directed acyclic allocation graph comprises
  - a node for each possible allocation of the plurality of logical qubits to the plurality of physical qubits, each allocation having a fidelity, and
  - a plurality of directed edges, each edge connecting to its corresponding first node from its corresponding second node, the first node corresponding to a first allocation, the second node corresponding to a sub-allocation of the first allocation;
- searching the directed acyclic allocation graph for a weighted shortest path from a root node of the directed acyclic allocation graph to a leaf node of the directed acyclic allocation graph; and
- outputting the allocation corresponding to the weighted shortest path.

2. The method of claim 1, wherein each edge of the directed acyclic allocation graph has a weight corresponding to a difference between a fidelity of the allocation corresponding to its first node and a fidelity of the sub-allocation corresponding to its second node.

3. The method of claim 1, wherein each node of the directed acyclic allocation graph has a weight corresponding to a fidelity of its corresponding allocation.

4. The method of claim 1, wherein searching the directed acyclic allocation graph comprises:
- selecting a parent node;
- determining a next node, the next node being a child of the parent node, by:
  - setting the next node to a first child of the parent node,
  - searching the directed acyclic allocation graph from the first child of the parent node, said searching being limited to a predetermined number of steps, thereby determining a cost corresponding to the first child,
  - searching the directed acyclic allocation graph from a second child of the parent node, said searching being limited to the predetermined number of steps, thereby determining a cost corresponding to the second child,
  - if the cost corresponding to the second child is less than the cost corresponding to the first child, setting the next node to the second child,
  - if the cost corresponding to the second child is not less than the cost corresponding to the first child, setting the next node to the second child with an iteration-dependent probability.

5. The method of claim 4, wherein the iteration-dependent probability is additionally dependent on a difference between the cost corresponding to the first child and the cost corresponding to the second child.

6. The method of claim 4, wherein determining the next node further comprises repeatedly:
- searching the directed acyclic allocation graph from an additional child of the parent node, said searching being limited to the predetermined number of steps, thereby determining a cost corresponding to the additional child,
- if the cost corresponding to the additional child is less than the cost corresponding to the next node, setting the next node to the additional child,
- if the cost corresponding to the additional child is not less than the cost corresponding to the next node, setting the next node to the additional child with a time-dependent probability.

7. The method of claim 4, further comprising repeating said determining step until reaching a leaf node of the directed acyclic allocation graph.

8. The method of claim 7, wherein each repetition of said determining step allocates one more qubit than the immediately prior determining step.

9. The method of claim 1, wherein searching the directed acyclic allocation graph comprises applying a randomized graph search.

10. The method of claim 9, wherein the randomized graph search comprises nested annealing.

11. The method of claim 9, wherein the randomized graph search comprises parallel tempering.

12. The method of claim 9, wherein the randomized graph search comprises genetic optimization.

13. The method of claim 1, wherein searching the directed acyclic allocation graph comprises identifying a plurality of candidate leaf nodes, and selecting one of the plurality of candidate leaf nodes corresponding to the weighted shortest path.

14. The method of claim 1, further comprising:
- adding to the connectivity graph at least one reverse edge corresponding to a controlled NOT (CNOT) gate.

15. The method of claim 1, further comprising:
- adding to the connectivity graph at least one reverse edge corresponding to a two-cubit gate.

16. The method of claim 1, wherein for each of the plurality of directed edges, the first allocation allocates one more logical qubit than the sub-allocation.

17. The method of claim 2, wherein for each of the plurality of directed edges, the weight corresponds to a difference in upper bounds on fidelities of the first allocation and the sub-allocation.

18. The method of claim 2, wherein for each of the plurality of directed edges, the weight corresponds to a difference in lower bounds on fidelities of the first allocation and the sub-allocation.

19. The method of claim 1, wherein the directed acyclic allocation graph comprises a tree.

20. The method of claim 1, wherein searching the directed acyclic allocation graph comprises applying Dijkstra's algorithm.

21. The method of claim 1, wherein searching the directed acyclic allocation graph comprises applying an A* search algorithm.

22. The method of claim 1, wherein searching the directed acyclic allocation graph comprises applying a breadth-first search.

23. The method of claim 1, wherein searching the directed acyclic allocation graph comprises applying a depth first search.

24. The method of claim 1, wherein searching the directed acyclic allocation graph comprises applying a depth-first branch-and-bound search.

25. The method of claim 1, wherein searching the directed acyclic allocation graph comprises applying an iterative deepening A* search.

26. The method of claim 1, wherein searching the directed acyclic allocation graph comprises applying a parallel depth-first search.

27. The method of claim 1, wherein the connectivity graph comprises a plurality of edges and the hardware specification further comprises fidelities for each of the plurality of edges of the connectivity graph.

28. The method of claim 1, further comprising:
executing the quantum circuit on a quantum computer according to the allocation corresponding to the weighted shortest path.

29. The method of claim 1, further comprising:
simulating the quantum circuit according to the allocation corresponding to the weighted shortest path.

30. The method of claim 1, further comprising:
outputting a quantum circuit description according to the allocation corresponding to the weighted shortest path.

31. The method of claim 30, further comprising:
configuration a quantum computer according to the outputted quantum circuit description.

32. The method of claim 1, further comprising:
outputting a set of allocations corresponding to a plurality of weighted shortest paths, the set comprising the allocation corresponding to the weighted shortest path.

33. A system comprising:
a computing node comprising a computer readable storage medium having program instructions embodied therewith, the program instructions executable by a processor of the computing node to cause the processor to perform a method comprising:
  receiving a description of a quantum circuit, the quantum circuit comprising a plurality of logical qubits;
  receiving a hardware specification, the hardware specification comprising a connectivity graph of a plurality of physical qubits;
  determining a directed acyclic allocation graph based on the plurality of logical qubits and the connectivity graph, wherein the directed acyclic allocation graph comprises
    a node for each possible allocation of the plurality of logical qubits to the plurality of physical qubits, each allocation having a fidelity, and
    a plurality of directed edges, each edge connecting to its corresponding first node from its corresponding second node, the first node corresponding to a first allocation, the second node corresponding to a sub-allocation of the first allocation;
  searching the directed acyclic allocation graph for a weighted shortest path from a root node of the directed acyclic allocation graph to a leaf node of the directed acyclic allocation graph; and
  outputting the allocation corresponding to the weighted shortest path.

34. A computer program product for quantum problem compilation, the computer program product comprising a computer readable storage medium having program instructions embodied therewith, the program instructions executable by a processor to cause the processor to perform a method comprising:
  receiving a description of a quantum circuit, the quantum circuit comprising a plurality of logical qubits;
  receiving a hardware specification, the hardware specification comprising a connectivity graph of a plurality of physical qubits;
  determining a directed acyclic allocation graph based on the plurality of logical qubits and the connectivity graph, wherein the directed acyclic allocation graph comprises
    a node for each possible allocation of the plurality of logical qubits to the plurality of physical qubits, each allocation having a fidelity, and
    a plurality of directed edges, each edge connecting to its corresponding first node from its corresponding second node, the first node corresponding to a first allocation, the second node corresponding to a sub-allocation of the first allocation;
  searching the directed acyclic allocation graph for a weighted shortest path from a root node of the directed acyclic allocation graph to a leaf node of the directed acyclic allocation graph; and
  outputting the allocation corresponding to the weighted shortest path.

* * * * *